United States Patent
Bovet et al.

(10) Patent No.: US 10,133,363 B2
(45) Date of Patent: Nov. 20, 2018

(54) METHOD OF OPERATING AN ELECTRONIC DEVICE

(71) Applicant: ETA SA MANUFACTURE HORLOGERE SUISSE, Grenchen (CH)

(72) Inventors: Jean-Luc Bovet, Solothurn (CH); Martin Jufer, Melchnau (CH); Andre Nussbaum, Bienne (CH); Laurent Christe, Bienne (CH)

(73) Assignee: ETA SA Manufacture Horlogère Suisse, Grenchen (CH)

(*) Notice: Subject to any disclaimer, the term of this patent is extended or adjusted under 35 U.S.C. 154(b) by 71 days.

(21) Appl. No.: 14/786,300

(22) PCT Filed: Apr. 16, 2014

(86) PCT No.: PCT/EP2014/057764
§ 371 (c)(1),
(2) Date: Oct. 22, 2015

(87) PCT Pub. No.: WO2014/173764
PCT Pub. Date: Oct. 30, 2014

(65) Prior Publication Data
US 2016/0070363 A1 Mar. 10, 2016

(30) Foreign Application Priority Data
Apr. 24, 2013 (EP) .................... 13165187

(51) Int. Cl.
*G06F 3/041* (2006.01)
*G06F 3/03* (2006.01)
(Continued)

(52) U.S. Cl.
CPC ............... *G06F 3/03* (2013.01); *G04G 21/08* (2013.01); *G06F 3/0202* (2013.01); *G06F 3/023* (2013.01); *H03K 17/962* (2013.01); *H03M 11/10* (2013.01)

(58) Field of Classification Search
CPC ...... G06F 3/0484; G06F 3/048; G06F 3/0482; G06F 11/0748; G06F 3/0233;
(Continued)

(56) References Cited

U.S. PATENT DOCUMENTS

| | | |
|---|---|---|
| 4,059,955 A | 11/1977 | Prak |
| 4,092,822 A | 6/1978 | Droz et al. |

(Continued)

FOREIGN PATENT DOCUMENTS

| | | |
|---|---|---|
| CH | 593 509 B5 | 12/1977 |
| EP | 0 698 983 A1 | 2/1996 |
| EP | 1 422 583 A1 | 5/2004 |

OTHER PUBLICATIONS

International Search Report dated May 19, 2014, in PCT/EP2014/057764 filed Apr. 16, 2014.

*Primary Examiner* — Duc Q Dinh
(74) *Attorney, Agent, or Firm* — Oblon, McClelland, Maier & Neustadt, L.L.P.

(57) ABSTRACT

A portable object including a case in which at least one electronic module is placed, the at least one electronic module configured to execute plural functions and to provide information relating to the functions to a display, the electronic device further including a controller including at least one contact area allowing a user to act on the at least one electronic module, each function being associated with a predetermined time threshold.

13 Claims, 2 Drawing Sheets

(51) Int. Cl.
*G04G 21/08* (2010.01)
*G06F 3/02* (2006.01)
*G06F 3/023* (2006.01)
*H03K 17/96* (2006.01)
*H03M 11/10* (2006.01)

(58) Field of Classification Search
CPC .. G06F 3/0237; G06F 3/04842; G06F 3/0416; G06F 1/1626; G06F 2203/04105
USPC .......................................... 345/169, 173–175
See application file for complete search history.

(56) References Cited

U.S. PATENT DOCUMENTS

| | | |
|---|---|---|
| 4,283,784 A | 8/1981 | Horan |
| 5,226,022 A | 7/1993 | Thinesen |
| 5,508,978 A | 4/1996 | Kalbermatter et al. |
| 5,587,971 A | 12/1996 | Thinsen |
| 8,943,246 B2 * | 1/2015 | Takahashi ............... A63F 13/00 341/22 |
| 2004/0100872 A1 | 5/2004 | Nobs |
| 2004/0130581 A1 * | 7/2004 | Howard ............... G06F 3/0482 715/854 |
| 2009/0225044 A1 * | 9/2009 | Jeon ..................... G06F 3/0418 345/173 |
| 2011/0117968 A1 * | 5/2011 | Eromaki ............... G06F 1/1616 455/566 |

\* cited by examiner

METHOD OF OPERATING AN ELECTRONIC DEVICE

CROSS-REFERENCE TO RELATED APPLICATIONS

This is a National phase application in the United States of International patent application PCT/EP2014/057764 filed Apr. 16, 2014 which claims priority on European patent application No. 13165187.9 filed Apr. 24, 2013. The entire disclosures of the above patent applications are hereby incorporated by reference.

The invention concerns an electronic device including a case comprising a glass and a back cover, said electronic device including at least one electronic module arranged to be able to execute several functions and to provide information relating to these functions to display means disposed underneath the glass and control means including at least two contact areas which the user can press to act on said at least one electronic module, each function being associated with a predetermined time threshold.

BACKGROUND OF THE INVENTION

There are known electronic devices including a LCD touch screen which can display information and activate the various functions of the device.

For example, there are known watches including a so-called touch glass having, on the lower face thereof, capacitive electrodes acting as touch keys. These keys are activated by a conventional push-piece. The user then touches the location of a capacitive electrode to activate the desired function.

One drawback of this method is that the user must pre-activate the touch keys before selecting a function and this therefore requires an additional operation. Further, this configuration requires a key to activate a function, which consequently limits the number of functions that the device can have.

There are also known electronic devices provided with a touch screen. The touch screen includes various touch keys. To select a function, the user lightly touches or taps and then releases a touch key. The time between the application of pressure and release of pressure is measured and then compared to predefined thresholds. In fact, each predefined threshold corresponds to a function so that the duration between the application of pressure and release of pressure determines the selection of a particular function.

One drawback of this method is that it is imprecise. Indeed, the user has to press for a relatively precise period of time in order to select a function. Control of this duration is complex and therefore the user frequently selects a different function to the one required.

One solution consists in having clearly defined durations, i.e. deciding that a duration of one second selects the first function, a duration of two seconds selects a second function, a duration of four seconds selects a third function. The drawback is that selection therefore takes time which may irritate the user.

SUMMARY OF THE INVENTION

It is an object of the invention to overcome the drawbacks of the prior art by proposing to provide an electronic device wherein the method for controlling the touch keys allows selection to be made in a fast and efficient manner.

To this end, the invention concerns an electronic device including a case in which at least one electronic module is placed, said at least one electronic module being arranged to be able to execute several functions and to provide information relating to these functions to display means, the electronic device comprising control means including at least one contact area allowing the user to act on said at least one electronic module, each function being associated with a predetermined time threshold, characterized in that the electronic module is arranged to detect a contact on said at least one contact area, to measure time starting from the contact and to compare it to said predetermined time thresholds in order to activate the function associated with the threshold attained.

In a first advantageous embodiment, the control means include three contact areas.

In a second advantageous embodiment, the electronic module is arranged to detect a contact on a maximum of two contact areas.

In a third advantageous embodiment, the various functions are grouped together in at least two series of functions, each series of functions being attached to a contact area.

In another advantageous embodiment, the case is closed by a back cover and a glass underneath which the display means are arranged, the control means being arranged on the glass.

In another advantageous embodiment, said electronic device is a watch.

In another advantageous embodiment, the electronic device also includes a first time measurement counter for selection of the desired function and a second time measurement counter for confirming said selection.

In another advantageous embodiment, the first counter measures time and compares it to the predetermined time thresholds, the second counter measures time when the first counter crosses one of the predetermined time thresholds, and the time measurement of the second counter is compared to a first predetermined value.

The invention also concerns a control method for an electronic device including a case in which at least one electronic module is placed, said at least one electronic module being arranged to be able to execute several functions and to provide information relating to these functions to display means, said electronic device further comprising control means including at least one contact area which the user can press to act on said at least one electronic module, each function being associated with a predetermined time threshold, characterized in that the method includes the following steps:

a) Detecting a contact on at least one of the contact areas;

b) Measuring time starting from detection of the contact using a first counter;

c) Comparing the measured time to predetermined time thresholds associated with functions of said electronic device;

d) When the measured time is equal to a predetermined time threshold, stopping the time measurement with the first counter, measuring time with a second counter and displaying on the display means an indication that the function associated with said predetermined time threshold is active;

e) If the contact is still detected when the second counter reaches a first predetermined value, restarting the time measurement with the first counter and moving to step c); otherwise configuring the electronic module so that a contact on at least one contact area makes it possible to act on the selected function.

In a first advantageous embodiment, the control means include at least two contact areas.

In a second advantageous embodiment, the control means include three contact areas.

In another advantageous embodiment, step a) consists in detecting a contact on a maximum of two contact areas.

In another advantageous embodiment, the various functions are grouped together into at least two series of functions, each series of functions being attached to a contact area.

BRIEF DESCRIPTION OF THE DRAWINGS

The objects, advantages and features of the electronic apparatus according to the present invention will appear more clearly in the following detailed description of at least one embodiment of the invention, given solely by way of non-limiting example and illustrated by the annexed drawings, in which.

DETAILED DESCRIPTION

Figure 1:
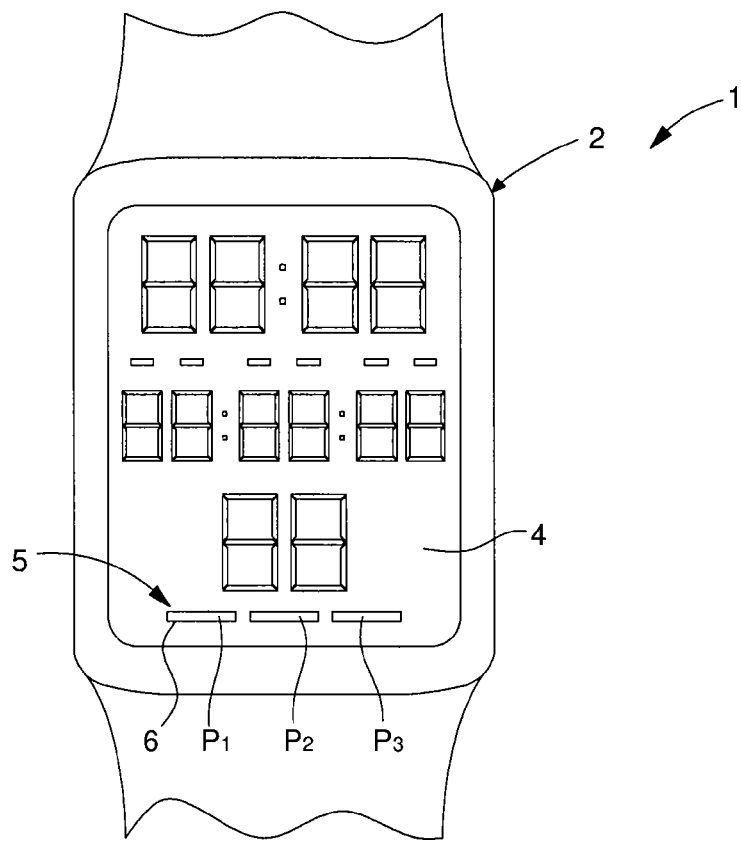
FIGS. 1 and 4 show schematic views of the portable object according to the invention.
Figure 4:
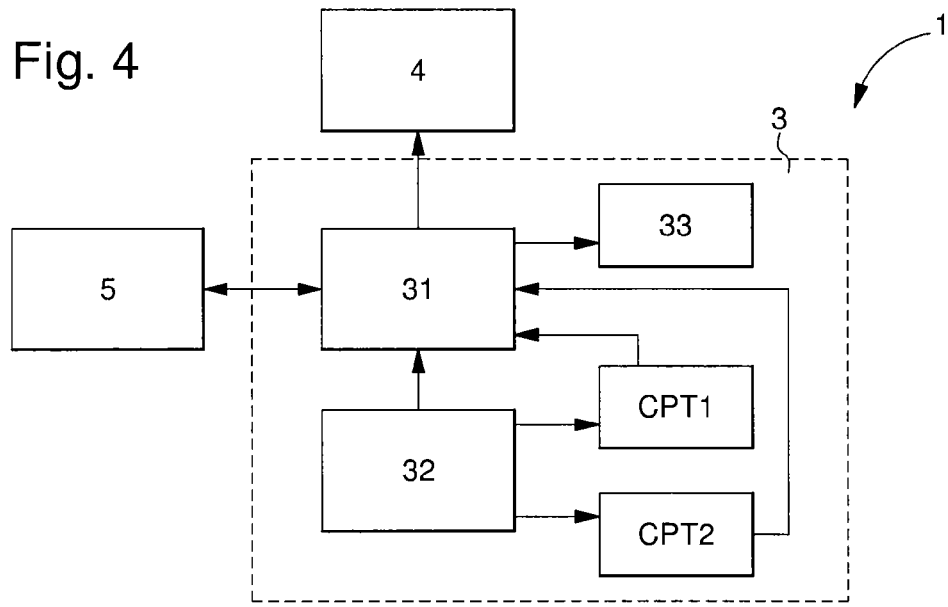

FIGS. 1 and 4 show a portable object 1 according to the invention. This portable object is an electronic device, such as a watch or a computer or a touch tablet or a telephone or smartphone. This device includes a case 2 including a glass and a back cover, said electronic device including at least one electronic module. This electronic module 3 is arranged to execute several functions and to provide information relating to these functions. The information relating to these functions is sent to display means 4 disposed underneath the glass. Electronic module 3 may include a microcontroller 31 cooperating with a time base 32 and various sensors 33 to provide time, pressure and temperature related information.

In a watch, electronic module 3 is arranged, in a normal operating mode, to display the current time. In an additional operating mode, the electronic module is arranged to execute one of the available functions, with the user selecting the desired function.

Control means 5 are arranged to control said electronic device. These control means 5 are arranged on the glass or in the case. These control means are touch control means 6, i.e. they react to actions of the user's fingers. These touch control means 6 are capacitive, i.e. an electrode is placed underneath the glass or under the case and the contact of the user's finger with the glass or the case at the location of the electrode causes a variation in capacitance. This variation in capacitance is detected and interpreted by electronic module 3.

In the portable object according to the invention, control means 5 include at least two contact areas or touch keys, which the user can press in order to act on said at least one electronic module 3. Of course, it will be understood that the user can lightly touch, tap, brush against or press the contact areas. All that is required is that a capacitance variation occurs.

Advantageously, the invention provides simple control of touch control means 6.

To achieve this, each function fct able to be executed by electronic module 3 is associated with a predefined threshold S. This predefined threshold S is a time value. Thus, a first function fct1 is associated with a first threshold S1, a second function fct2 is associated with a second threshold S2 and so on. For example, the first threshold is 0.5 seconds, the second threshold is one second.

Figure 3:
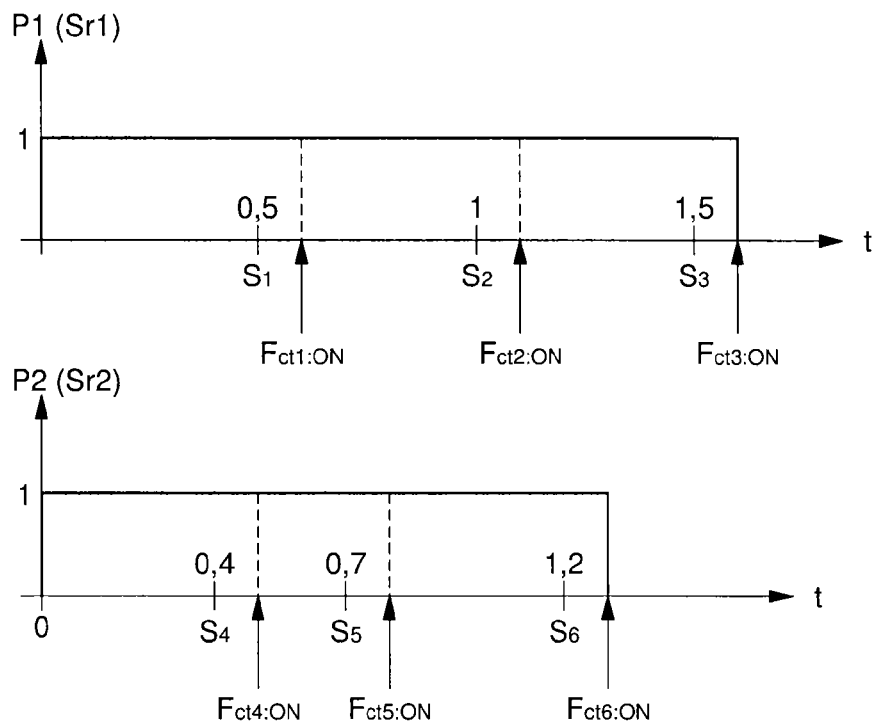
FIG. 3 shows an operating diagram according to a second embodiment.

In a first embodiment seen in FIG. 3, each touch key is associated with a series Sr of functions fct. For example, the portable object is provided with a first touch key P1 and a second touch key P2. Each series of functions Sr groups together functions fct. This grouping may be by theme, i.e. time-related functions fct are grouped together in one series while sensor-related functions are grouped together in another series.

For example, the first function series Sr1 includes first function fct1 associated with threshold S1, second function fct2 associated with threshold S2 and third function fct3 associated with threshold S3. The second function series Sr2 includes fourth function fct4 associated with threshold S4, fifth function fct5 associated with threshold S5 and sixth function fct6 associated with threshold S6. The first function series Sr1 is associated with first touch key P1 while the second function series Sr2 is associated with second touch key P2. Each function fct is associated with a predefined threshold S.

Firstly, when the user wishes to activate a function, he will tap or touch the desired key, for example touch key P1. As soon as the contact or pressing is detected by electronic module 3, a first counter CPT1 connected to microcontroller 31 starts to count the time via time base 32.

This time is then compared to the predefined thresholds S of the functions fct of the series Sr associated with touch key P1.

Secondly, when a threshold S is reached, microcontroller 31 detects this and acts accordingly. Microcontroller 31 stops the counting by first counter CPT1 and displays on the screen an indication that function fct1 associated with first predefined threshold S1 is activated.

Simultaneously, a second counter CPT2 starts to count. This counting occurs such that after a first predetermined value, for example five seconds, microcontroller 31 tests whether or not pressing is detected. This confirms the selection of the function.

If pressing is no longer detected, microcontroller 31 will interpret the release of contact or pressure as confirmation that the selected function fct1 is the desired function. Activation of function fct1 is thus confirmed. Thirdly, portable object 1 enters an additional operating mode in which the user can simply use touch keys P1 and P2 to act on the selected function.

Fourthly, if pressing is still detected, the counting of first counter CPT1 starts again. The preceding process then starts again.

When the first counter CPT1 counts as far as the second predefined threshold Sr2, microcontroller 31 displays on the screen an indication that function fct2 is activated. When the display indicates that function fct2 is activated, first counter CPT1 stops counting.

The second counter CPT2 is simultaneously reset to zero and starts counting again.

If, after the first predetermined value, pressing is still detected, first counter CPT1 starts counting again, otherwise function fct2 is activated and the user can act on this function.

For the last function fct-n of the first series Sr1, the same process is carried out. If, after a predetermined first value, pressing is still detected, microcontroller 31 understands that no function needs to be executed. It returns to the normal operating mode in which the current time is displayed.

Figure 2:
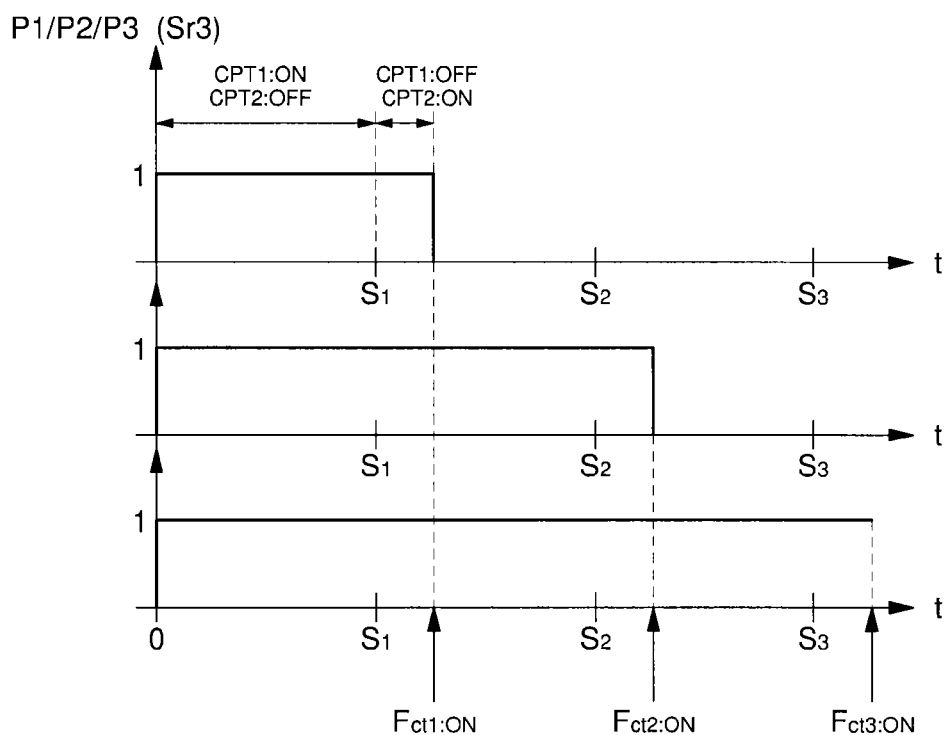
FIG. 2 shows an operating diagram according to a first embodiment.

In a second embodiment seen in FIG. 2, the various functions fct are grouped together in a single series Sr3. This series Sr3 is accessible via the various touch keys. For example, the portable object is provided with a first touch key P1, a second touch key P2 and a third touch key P3. The function selection operations are similar to those of the first embodiment.

Firstly, when the user wishes to activate a function, he will press one of the keys, for example touch key P1. As soon as pressing is detected by electronic module 3, a first counter CPT1 starts to count the time via the time base. This time is then compared to the predefined thresholds S of the functions fct of the series Sr associated with touch key P1.

Secondly, when a threshold S is reached, microcontroller 31 detects this and acts accordingly. Microcontroller 31 stops the counting by first counter CPT1 and will then display on the screen an indication that the function fct1 associated with the first predefined threshold Sr1, which has been reached, is activated.

When the microcontroller displays the indication that the associated function fct1 is activated, a second counter CPT2 simultaneously starts counting. This counting occurs such that after a first predetermined value, for example five seconds, microcontroller 31 tests whether or not pressing is detected.

If pressing is no longer detected, the microcontroller will interpret the release of pressure as confirmation that the selected function fct1 is the desired function. The user can then simply use touch keys P1 and P2 to act on the selected function.

If pressing is still detected, the first counter CPT1 starts counting again. When the first counter CPT1 counts as far as the second predefined threshold S2, microcontroller 31 displays on the screen an indication that function fct2 is activated. When the display indicates that function fct2 is activated, first counter CPT1 stops counting, and so on.

The process is repeated until the last function and if the latter is not confirmed by the user then the normal mode is displayed.

The method thus includes the following steps:

a) Detecting a contact on at least one of the contact areas P1, P2, P3;

b) Measuring time starting from detection of the contact using a first counter CPT1;

c) Comparing the measured time to predetermined time thresholds S associated with functions fct of said electronic device;

d) When the measured time is equal to a predetermined time threshold S, stopping the time measurement with the first counter CPT1, measuring time with a second counter CPT2 and displaying on the display means an indication that the function associated with said predetermined time threshold is active;

e) If the contact is still detected when the second counter reaches a first predetermined value, restarting the time measurement with the first counter and moving to step c); otherwise configuring the electronic module so that a contact on one of the at least two contact areas makes it possible to act on the selected function.

The advantage of such an embodiment is that it allows the user to activate the different functions regardless of which touch key is used. Thus the user does not need to retain a specific combination.

In a variant, the different functions fct of series Sr3 could be selected when the user presses two contact areas or touch keys at the same time. This variant advantageously makes it possible to select different functions even if the user does not simply press one key but overshoots and presses two keys. Likewise, in the case where the touch keys are small and the user has large fingers, this does not affect the ability of the user to select and activate functions.

However, a safety device could be provided to prevent a function being selected if it is detected that all of the touch keys are pressed.

It will be clear that various alterations and/or improvements and/or combinations evident to those skilled in the art may be made to the various embodiments of the invention set out above without departing from the scope of the invention defined by the annexed claims.

The invention claimed is:

1. An electronic device comprising:
a case in which at least one electronic circuit is placed, the at least one electronic circuit configured to execute plural functions and to provide information relating to the functions to a display; and
a controller including at least one contact area allowing a user to act on the at least one electronic circuit, each function being associated with a predetermined time threshold,
wherein the electronic circuit is configured to detect contact on the at least one contact area to activate the function associated with the threshold reached, the electronic circuit including a first time measurement counter to select a desired function, the first time measurement counter beginning to measure time starting from the contact and comparing the time to the predetermined time thresholds, and a second time measurement counter to confirm the selection, the second time measurement counter starting to measure time when one of the predetermined time thresholds is crossed by the first time measurement counter and the display displaying an indication that the function associated with the one of the predetermined time thresholds is active, and
wherein, when contact is still detected during measurement of time by the second time measurement counter, the first time measurement counter is restarted to repeat comparison of the time to the predetermined time thresholds once the second time measurement counter reaches a first predetermined value and, when contact is not detected during the measurement of time by the second time measurement counter, the electronic circuit is configured so that contact on the at least one contact area makes it possible to act on the selected function.

2. The electronic device according to claim 1, wherein the controller includes three contact areas.

3. The electronic device according to claim 2, wherein the electronic circuit is configured to detect a contact on a maximum of two contact areas.

4. The electronic device according to claim 2, wherein the plural functions are grouped together into at least two series of functions, each series of functions being attached to a contact area.

5. The electronic device according to claim 1, wherein the case includes a glass underneath which the display is arranged, the controller being arranged underneath the glass.

6. The electronic device according to claim 1, wherein the electronic device is a watch.

7. A control method for an electronic device including a case in which at least one electronic circuit is placed, the at least one electronic circuit configured to execute plural functions and to provide information relating to the functions to a display, the electronic device further including a controller including contact areas which a user can press to act on the at least one electronic circuit, each function being associated with a predetermined time threshold, the method comprising:

detecting contact on at least one of the contact areas;

measuring time starting from the detecting of contact using a first counter;

comparing the time measured by the first counter to a predetermined time threshold for a function of the electronic device;

when the measured time is equal to the predetermined time threshold, stopping the time measurement with the first counter, starting to measure time with a second counter and displaying on the display an indication that the function associated with the predetermined time threshold is active;

when contact is still detected, restarting the time measurement with the first counter and moving to the comparing once the second counter reaches a first predetermined value; and when contact is not detected, configuring the electronic circuit so that contact on the at least one of the contact areas makes it possible to act on the selected function.

8. The electronic device control method according to claim 7, wherein the controller includes at least two contact areas.

9. The electronic device control method according to claim 8, wherein the controller includes three contact areas.

10. The electronic device control method according to claim 8, wherein the detecting detects a contact on a maximum of two contact areas.

11. The electronic device control method according to claim 9, wherein the detecting detects a contact on a maximum of two contact areas.

12. The electronic device control method according to claim 7, wherein the plural functions are grouped together into at least two series of functions, each series of functions being attached to a contact area.

13. The electronic device control method according to claim 8, wherein the plural functions are grouped together into at least two series of functions, each series of functions being attached to a contact area.

\* \* \* \* \*